United States Patent
Sanchez et al.

(10) Patent No.: US 10,400,971 B2
(45) Date of Patent: Sep. 3, 2019

(54) LIGHTING MODULE WITH DIOPTRIC INTERFACE FOR MOTOR VEHICLE

(71) Applicant: VALEO VISION, Bobigny (FR)

(72) Inventors: Vanessa Sanchez, Bobigny (FR); Pierre Albou, Bobigny (FR); Gilles Le Calvez, Bobigny (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 15/759,630

(22) PCT Filed: Sep. 12, 2016

(86) PCT No.: PCT/EP2016/071428
§ 371 (c)(1),
(2) Date: Mar. 13, 2018

(87) PCT Pub. No.: WO2017/046031
PCT Pub. Date: Mar. 23, 2017

(65) Prior Publication Data
US 2018/0252378 A1   Sep. 6, 2018

(30) Foreign Application Priority Data
Sep. 14, 2015 (FR) ..................... 15 58526

(51) Int. Cl.
*F21S 41/141* (2018.01)
*H01L 33/24* (2010.01)
(Continued)

(52) U.S. Cl.
CPC ........... *F21S 41/141* (2018.01); *F21S 41/155* (2018.01); *F21S 41/285* (2018.01); *F21S 41/36* (2018.01);
(Continued)

(58) Field of Classification Search
CPC ...... F21V 19/003; F21V 23/001; F21V 29/80; F21S 43/14; F21S 41/147; F21S 41/19;
(Continued)

(56) References Cited

U.S. PATENT DOCUMENTS

2011/0204327 A1   8/2011  Hiruma et al.
2011/0254034 A1   10/2011 Konsek et al.
(Continued)

FOREIGN PATENT DOCUMENTS

EP   2306074 A2   4/2011
EP   2357676 A1   8/2011
(Continued)

OTHER PUBLICATIONS

PCT EP2016-071428, international search report, Translated Dec. 2016.*
(Continued)

*Primary Examiner* — Tracie Y Green
(74) *Attorney, Agent, or Firm* — Oblon, McClelland, Maier & Neustadt, L.L.P.

(57) ABSTRACT

A motor-vehicle lighting module, including a semiconductor light source including light-emitting rods of submillimeter-sized dimensions, and one optic for shaping light rays emitted by the light source, the light source including two selectively activatable zones the luminance of one of which is higher than 80 Cd/mm².

11 Claims, 4 Drawing Sheets

(51) Int. Cl.
  *F21S 41/20* (2018.01)
  *F21S 41/36* (2018.01)
  *F21S 41/60* (2018.01)
  *F21S 41/155* (2018.01)
  *F21S 41/663* (2018.01)
  *F21S 41/143* (2018.01)
  *F21S 41/25* (2018.01)
  *F21S 41/148* (2018.01)

(52) U.S. Cl.
  CPC ............. *F21S 41/60* (2018.01); *F21S 41/663* (2018.01); *H01L 33/24* (2013.01); *F21S 41/143* (2018.01); *F21S 41/148* (2018.01); *F21S 41/25* (2018.01)

(58) Field of Classification Search
  CPC .......... F21S 43/26; F21S 43/19; F21S 41/285; F21S 45/47; F21S 41/151; F21S 41/176; H01L 25/0753; H01L 25/0756
  See application file for complete search history.

(56) References Cited

U.S. PATENT DOCUMENTS

2014/0239327 A1  8/2014  Konsek et al.
2015/0118777 A1  4/2015  Seo et al.
2015/0303350 A1  10/2015  Seo et al.

FOREIGN PATENT DOCUMENTS

FR  2983639 A1  6/2013
WO  2010/014032 A1  2/2010

OTHER PUBLICATIONS

International Search Report dated Nov. 14, 2016, in PCT/EP2016/071428, filed Sep. 12, 2016.

\* cited by examiner

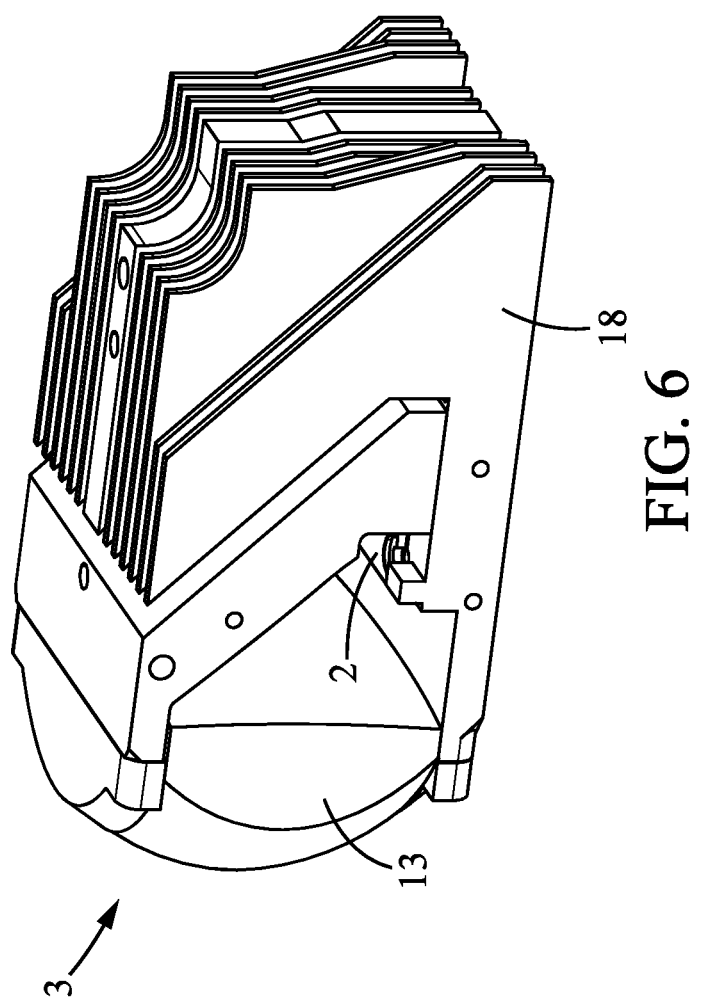

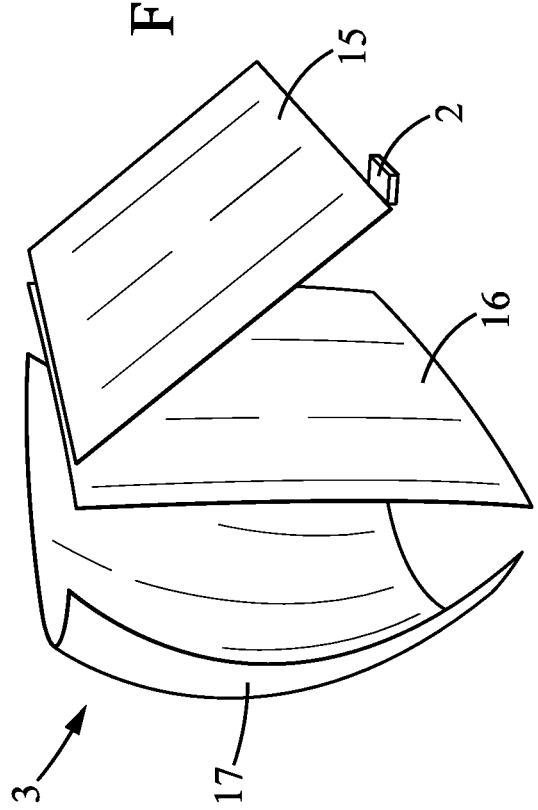

LIGHTING MODULE WITH DIOPTRIC INTERFACE FOR MOTOR VEHICLE

The invention relates to a motor-vehicle lighting module comprising a light source equipped with a plurality of semiconductor emitters, and optical means for shaping the light emitted by the light source.

In such a known lighting module, the semiconductor emitters are light-emitting diodes (LEDs) that are mounted securely fastened to one another in a matrix array.

Thus, such a lighting module benefits from the advantages of light-emitting diodes, in particular their low power consumption and a lifetime of about that of the equipped vehicle.

To manufacture the LED matrix array, the LEDs are assembled into rows and columns, the assembly process not being flawless and leaving a space, between the LEDs, such that an output light beam, generated by the lighting module, contains multiple dark zones.

Another drawback of LED matrix arrays is due to the fact that each LED has a low luminance that limits, for a given area and therefore a given bulk, the light intensity of the light beam emitted by the lighting module. The luminance of the LEDs is limited by their very nature.

However, in particular with regard to use in a high-beam motor-vehicle application, the light intensity of the light beam emitted by the lighting module must be high.

Given that light intensity is limited by the luminance of the LEDs on the one hand, and that, on the other hand, the distance between the source and the optical shaping means is set by the model of the motor vehicle, it may prove to be necessary to make provision for the shaping means, and in particular for a projecting system of the shaping means, to have a short focal length.

Nevertheless, as these shaping means must have a high numerical aperture in order to ensure a good performance with regard to light collection, such a configuration generates geometric and chromatic aberrations, in particular for point sources that are distant from an optical axis of the shaping means.

The light beam emitted by the lighting module will thus be blurry and colored, and it is then necessary, in order to make it compliant with the legislation in force, to increase the complexity of the shaping means by multiplying the number of correcting elements, this unavoidably impacting the final cost of the lighting module and its weight and its bulk.

The aim of the invention is to at least partially remedy these drawbacks.

To this end, the subject of the invention is a motor-vehicle lighting module, comprising a semiconductor light source comprising light-emitting rods of submillimeter-sized dimensions, and at least one optic for shaping light rays emitted by the light source, the light source including at least two selectively activatable zones the luminance of at least one of which is at least higher than 80 Cd/mm$^2$.

The shaping means need only have a small aperture to achieve a desired light intensity, even in a high-beam configuration, thereby allowing geometric and chromatic aberrations to be avoided.

According to another feature of the invention, the luminance of at least one activatable zone is at least higher than 100 Cd/mm$^2$ or even at least higher than 120 Cd/mm$^2$.

According to another feature of the invention, the optic for shaping the light comprises at least two dioptric interfaces.

According to another feature of the invention, the optic for shaping the light comprises at most four dioptric interfaces.

According to another feature of the invention, the shaping optic consists of a primary optic and a lens or of an adhesively bonded doublet or of a mirror and a lens.

According to another feature of the invention, the optic for shaping the light comprises at most three dioptric interfaces.

According to another feature of the invention, the shaping optic consist of an adhesively bonded triplet or of a non-adhesively bonded doublet or of an adhesively bonded doublet and a mirror or a lens and two mirrors.

Other features and advantages of the invention will become more clearly apparent on reading the following description. The latter is purely illustrative and must be read with regard to the appended drawings, in which:

FIG. 6 illustrates a perspective view of a shaping optic of the lighting module of FIG. 1 according to another embodiment; and FIG. 7 illustrates a perspective view of a shaping optic of the lighting module of FIG. 1 according to another embodiment.

Figure 1:
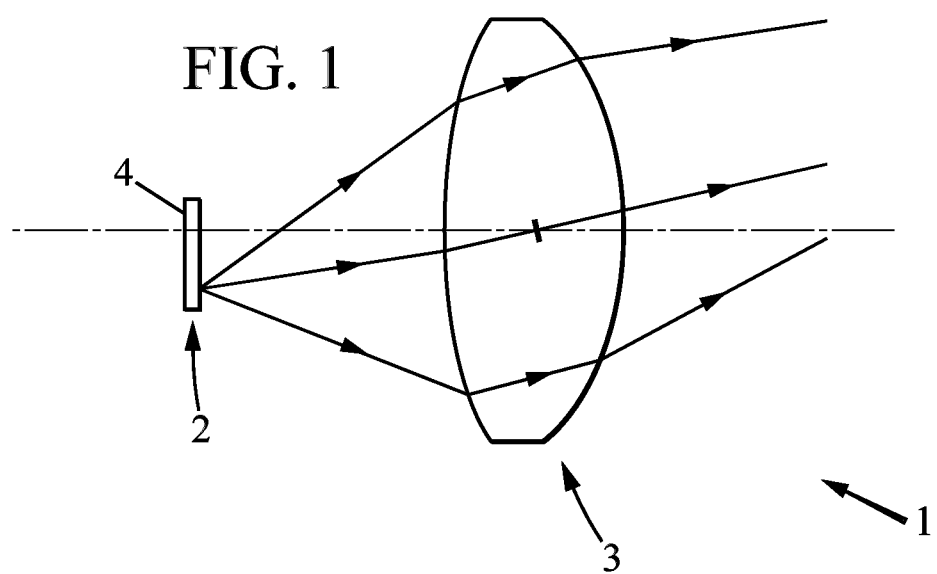
FIG. 1 illustrates a cross-sectional view of a lighting module according to the present invention.

As shown in FIG. 1, the subject of the invention is a motor-vehicle lighting module, referenced 1.

The lighting module 1 comprises a semiconductor light source 2 that is able to emit light rays, and at least one optic 3 for shaping the light rays emitted by the light source.

Light Source

As shown in FIG. 1, the light source 2 comprises at least one light-emitting rod 4.

Figure 2:
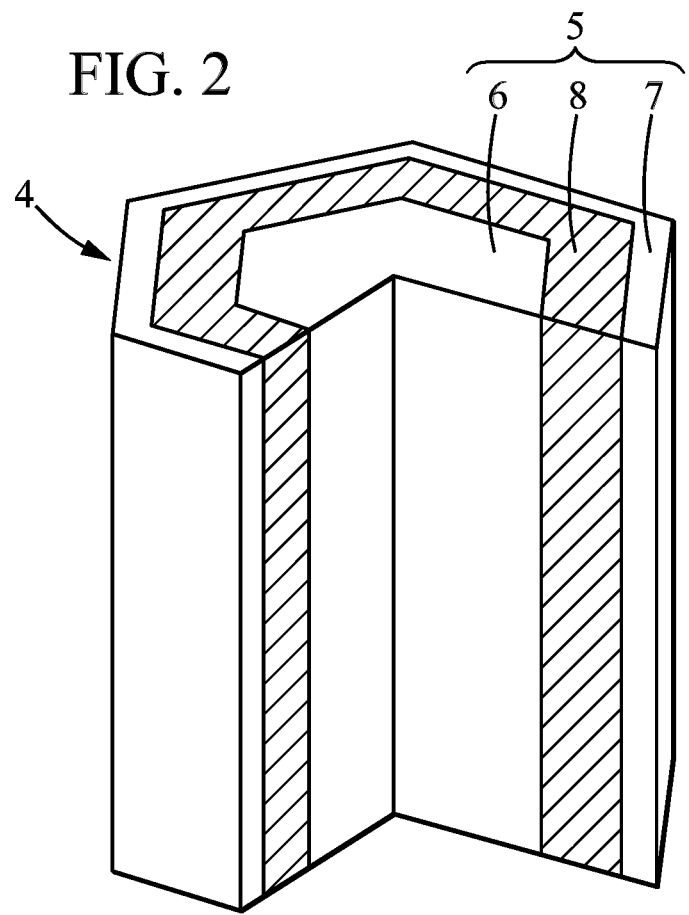
FIG. 2 illustrates a perspective view of a light-emitting rod of submillimeter-sized dimensions of a light source of the lighting module of FIG. 1.

FIG. 2 illustrates in detail a light-emitting rod 4.

The light-emitting rod 4 has submillimeter-sized dimensions.

As shown in FIG. 2, the light-emitting rod 4 is a diode of generally vertical columnar shape, for example of hexagonal cross section.

The light-emitting rod 4 comprises an assembly 5 of at least three layers that are placed substantially orthogonal to a substrate.

A first vertical layer 6 of the assembly 5 consists of a semiconductor of a first doping type, whereas a second vertical layer, 7, of the assembly 5, consists of a semiconductor of a second doping type, opposite to the first type.

In other words, if the first vertical layer 6 is n-type (n for negative i.e. doped with electrons), then the second vertical layer 7 is p-type (p for positive i.e. doped to create holes), and, if the first vertical layer 6 is p-type, then the second vertical layer 7 is n-type.

A zone in which the electron-hole pairs of the semiconductor layers 6 and 7 recombine forms an active layer 8 of the assembly 5.

Two electrodes (not shown) are connected to the first active layer 6 and the second active layer 7, respectively, in order that an electrical current may be generated in the light-emitting rod 4.

As shown in FIG. 2, the layers 6, 7 and 8 of the assembly 5 lie substantially parallel to one another.

Recombination of electron-hole pairs along the length of the active layer 8 ensures that light rays are preferentially emitted in a radial direction from the light-emitting rod 4.

The layers 6 and 7 are for example made of GaN.

The substrate for example comprises Si.

Preferably, each layer 6, 7 and 8 extends a length of about a few microns, for example of about 2 μm, for a cross section of about 1.6 μm diameter.

Figure 3:
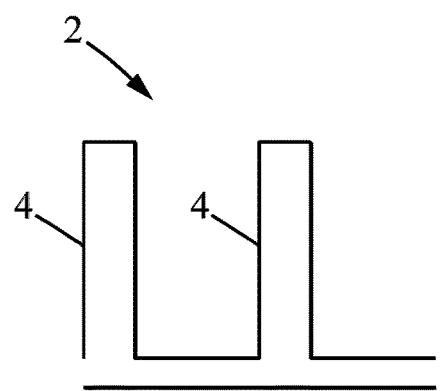
FIG. 3 illustrates a cross-sectional view of the light source of FIG. 2.

As shown in FIG. 3, the light source 2 preferably comprises a plurality of light-emitting rods 4 that are advantageously identical to one another.

The light-emitting rods 4 lie substantially parallel to one another.

The light-emitting rods 4 are spaced apart from one another by a distance for example of about 10 μm.

The light source 2 includes at least two selectively activatable zones, the luminance of at least one activatable zone being at least higher than 80 Cd/mm$^2$.

Advantageously, the luminance of at least one activatable zone is at least higher than 100 Cd/mm$^2$, or even at least higher than 120 Cd/mm$^2$.

Shaping Optic

The expressions "shaping optic" and "optic for shaping" are understood to mean an optical device comprising at least one dioptric interface and configured to deviate at least some of the light rays emitted by the source.

The optic 3 for shaping the light rays emitted by the light source 2 ensures a controlled projection of the rays emitted by the light source 2.

Advantageously, the optic for shaping the light comprises at least two dioptric interfaces.

By dioptric interface, what is meant is an interface separating two media of different refractive indices.

Preferably, the shaping optic comprises at most four dioptric interfaces, or even, advantageously, at most three dioptric interfaces.

Specifically, because of the high luminance of the source 2 of the light, the shaping optic may be simplified with respect to the prior art; in particular, a small aperture is sufficient to obtain the intensity desired for the image projected by the lighting module 1.

Thus, three dioptric interfaces are enough to obtain a clear projected image, without unacceptable aberration (and in particular unacceptable chromatic aberration) and of an intensity compliant with the legislation in force.

In the two-dioptric-interface configuration, the shaping optic 3 for example comprises a lens or even two mirrors arranged with respect to each other so as to form a telescope.

The telescope has the advantage of being achromatic.

It is also possible for each dioptric interface, or at least one of the dioptric interfaces, to contain diffracting patterns.

Diffracting patterns allow chromatic aberration (hybrid doublet) to be corrected.

Figure 4:
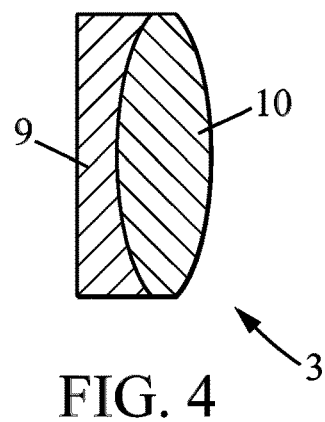
FIG. 4 illustrates a cross-sectional view of a shaping optic of the lighting module of FIG. 1 according to one embodiment.
Figure 5:
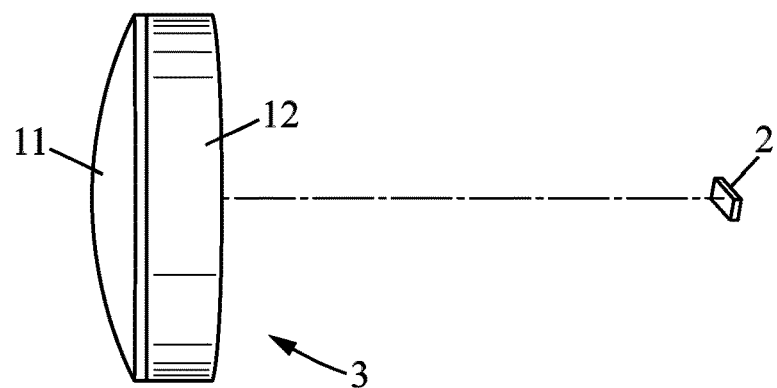
FIG. 5 illustrates a more detailed perspective view of a shaping optic of the lighting module of FIG. 1.

In the three-dioptric-interface configuration, according to a first variant illustrated in FIGS. 4 and 5, the shaping optic consists of an adhesively bonded doublet, also called an achromatic doublet.

In FIG. 4, the adhesively bonded doublet comprises a plano-concave lens 9 and a biconvex lens 10.

The concave dioptric interface of the lens 9 makes contact with one of the convex dioptric interfaces of the biconvex lens 10, their concavities being identical in absolute value.

The diameter of each lens is about 30 mm.

The focal length of the adhesively bonded doublet is about 50 mm.

In FIG. 5, the adhesively bonded doublet comprises two biconcave lenses 11 and 12

One of the concave dioptric interfaces of the lens 11 makes contact with one of the concave dioptric interfaces of the lens 12, their concavities being identical. To obtain this form, one of the lenses is for example made of silicone.

According to another variant, illustrated in FIG. 6, the three-dioptric-interface shaping optic 3 consists of a lens 13 and a mirror 14.

The mirror 14 is a nonplanar fold mirror designed in collaboration with the lens in order to minimize the geometric aberrations of the shaping optic 3.

As shown in FIG. 6, the shaping optic 3 also comprises a heat sink 18.

According to another variant (not illustrated), the shaping optic consists of a three-faced prism at least one of the faces of which is preferably not planar.

According to this variant, a light ray of the light source 2 penetrates into the prism by refraction at a first face of the prism, before being reflected by a second face of the prism.

Next, the light ray exits from the prism by refraction at a third face.

According to another variant (not illustrated), the shaping optic consists of three mirrors.

In the four-dioptric-interface configuration, according to variants none of which are illustrated, the shaping optic consists of an adhesively bonded triplet, or a non-adhesively bonded doublet, or even an adhesively bonded doublet and a mirror, or four mirrors, or a three-faced prism and a mirror, or a rhomboid prism.

The non-adhesively bonded doublet is for example a Galilean telescope or a single Gauss lens.

The rhomboid prism allows a light ray emitted by the source 2 to enter via refraction at a first face of the rhomboid, then to be reflected a first and a second time from two other faces of the rhomboid.

Next, the light ray exits from the prism via refraction at a fourth face.

According to another embodiment illustrated in FIG. 7, the shaping optic consists of a mirror 15, an entrance lens 16 and an exit lens 17.

A light ray emitted by the light source 2 is reflected by the mirror 15, then passes in succession through the lenses 16 and 17.

As already indicated, because of the high luminance of the light source 2, a small aperture is sufficient to obtain the intensity desired for the image projected by the lighting module 1, thereby allowing the shaping optic to be simplified and the number of dioptric interfaces therein to be decreased.

The invention claimed is:

1. A motor-vehicle lighting module, comprising a semiconductor light source comprising light-emitting rods of submillimeter-sized dimensions, and at least one optic for shaping light rays emitted by the light source, the light source including at least two selectively activatable zones,
   wherein the optic for shaping the light comprises at least three dioptric interfaces, and each dioptric interface separates media of different refractive indices.

2. The lighting module as claimed in claim 1, wherein the luminance of at least one activatable zone is at least higher than 100 Cd/mm$^2$.

3. The lighting module as claimed in claim 1, wherein the luminance of at least one activatable zone is at least higher than 80 Cd/mm$^2$.

4. The lighting module as claimed in claim 1, wherein at least one of the at least three dioptric interfaces contains a diffracting pattern.

5. The lighting module as claimed in claim 1, wherein the shaping optic comprises at most four dioptric interfaces.

6. The lighting module as claimed in claim 5, wherein the shaping optic consists of an adhesively bonded doublet, a three-faced prism, or of three mirrors.

7. The lighting module as claimed in claim 5, wherein the shaping optic consists of an adhesively bonded triplet, a non-adhesively bonded doublet, an adhesively bonded doublet and a mirror, four mirrors, a three-faced prism and a mirror, or a rhomboid prism.

8. The lighting module as claimed in claim 2, wherein the luminance of one activatable zone is higher than 80 Cd/mm$^2$.

9. The lighting module as claimed in claim 2, wherein at least one of the at least three dioptric interfaces contains a diffracting pattern.

10. The lighting module as claimed in claim 2, wherein the shaping optic comprises at most four dioptric interfaces.

11. A motor-vehicle lighting module, comprising a semiconductor light source comprising light-emitting rods of submillimeter-sized dimensions, and at least one optic for shaping light rays emitted by the light source, the light source including at least two selectively activatable zones, wherein the optic for shaping the light comprises at least one dioptric interface which separates media of different refractive indices, and the optic comprises a non-adhesively bonded doublet, adhesively bonded doublet, or adhesively bonded triplet.

* * * * *